(12) United States Patent
Schmaltz et al.

(10) Patent No.: US 11,963,315 B2
(45) Date of Patent: Apr. 16, 2024

(54) HOUSING FOR A PORTABLE ELECTRONIC DEVICE

(71) Applicant: Deere & Company, Moline, IL (US)

(72) Inventors: Mark D. Schmaltz, Reile's Acres, ND (US); Todd A. Pringle, Reile's Acres, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 17/249,973

(22) Filed: Mar. 19, 2021

(65) Prior Publication Data

US 2022/0304170 A1 Sep. 22, 2022

(51) Int. Cl.
*H05K 5/00* (2006.01)
*H05K 5/02* (2006.01)

(52) U.S. Cl.
CPC ......... *H05K 5/0086* (2013.01); *H05K 5/0017* (2013.01); *H05K 5/023* (2013.01)

(58) Field of Classification Search
CPC .. H04M 1/0202; G06F 1/1626; H05K 5/0086; H05K 5/0017; H05K 5/023; G02F 1/133314; G02F 1/13332
See application file for complete search history.

(56) References Cited

U.S. PATENT DOCUMENTS

| | | | |
|---|---|---|---|
| 6,028,765 A * | 2/2000 | Swindler | G06F 1/1656 361/679.55 |
| 6,144,552 A * | 11/2000 | Whitcher | G02F 1/133308 345/905 |
| 6,560,092 B2 * | 5/2003 | Itou | G06F 1/1656 361/679.55 |
| 8,014,148 B2 * | 9/2011 | Mori | H05K 5/0017 455/575.8 |
| 8,186,514 B2 | 5/2012 | Bowers | |
| 10,039,196 B2 * | 7/2018 | Meguro | H05K 5/023 |
| 10,545,533 B1 * | 1/2020 | Shen | G06F 1/1658 |
| 10,607,048 B2 * | 3/2020 | Paolizzi | G06F 1/1662 |
| 10,671,119 B2 * | 6/2020 | Ohtaka | H04M 1/0262 |
| 10,725,504 B1 * | 7/2020 | Tsai | G06F 1/1626 |
| 10,750,844 B2 | 8/2020 | Peterson et al. | |
| 10,820,674 B2 | 11/2020 | Brown et al. | |
| 10,963,008 B2 * | 3/2021 | Shen | G06F 1/1658 |
| 10,963,068 B2 * | 3/2021 | Giragossian | G06F 3/0236 |
| 2009/0219684 A1 * | 9/2009 | Mori | G06F 1/1671 361/679.56 |

(Continued)

OTHER PUBLICATIONS

U.S. Appl. No. 29/788,121, filed Mar. 19, 2021.

(Continued)

*Primary Examiner* — Sagar Shrestha
(74) *Attorney, Agent, or Firm* — Crowell & Moring LLP

(57) ABSTRACT

In accordance with one embodiment, a housing is configured to receive a portable electronic device. The housing comprises a front frame that has elevated rectangular border and corner members around a central electronic display. Ones of the corner members have generally planar sections that are joined by a radiused edges or chamfered edges. A rear frame comprises edge members that are joined at substantially orthogonal angles of at the plurality of corner members. A first vertical protrusion extends outward from the rear frame. The first vertical protrusion has an first axis and an arched cross section or mounded cross section with a central peak region.

15 Claims, 7 Drawing Sheets

(56) References Cited

U.S. PATENT DOCUMENTS

| | | | | |
|---|---|---|---|---|
| 2010/0025286 | A1* | 2/2010 | Mangaroo | G06F 1/1684 |
| | | | | 206/701 |
| 2010/0073869 | A1* | 3/2010 | Mangaroo | G06K 7/0004 |
| | | | | 361/679.55 |
| 2011/0203890 | A1 | 8/2011 | Chung et al. | |
| 2012/0037285 | A1 | 2/2012 | Diebel et al. | |
| 2012/0068936 | A1* | 3/2012 | Kim | H04M 1/236 |
| | | | | 345/169 |
| 2012/0314354 | A1* | 12/2012 | Rayner | G06F 1/1633 |
| | | | | 361/679.01 |
| 2013/0107126 | A1* | 5/2013 | Nonomura | H04N 5/64 |
| | | | | 361/679.41 |
| 2015/0270734 | A1* | 9/2015 | Davison | H04B 1/3888 |
| | | | | 320/103 |
| 2015/0278557 | A1* | 10/2015 | Yasutomi | G06F 1/1684 |
| | | | | 361/679.3 |
| 2018/0084654 | A1* | 3/2018 | Meguro | H05K 5/0086 |
| 2019/0197272 | A1* | 6/2019 | Paolizzi | G06K 7/10881 |
| 2020/0142451 | A1* | 5/2020 | Chiba | H04M 1/0262 |
| 2020/0285278 | A1* | 9/2020 | Shen | H05K 5/03 |

OTHER PUBLICATIONS

ZCover Dock-in-Case CI821HRN—protective cover for wireless phone, pp. 1-2, Retrieved from the Internet <URL: https://www.cdw.com/product/zcover-dock-in-case-ci821hrn-protective-cover-for-wireless-phone/6049995#PO>.

Presidio Grip Google Pixel 3 Cases, pp. 1-5, Retrieved from the Internet <URL: https://www.speckproducts.com/google/google-pixel-3-cases/presidio-grip-google-pixel-3-cases/GPX3-PR-GRIP.html>.

Guardian—2019 Google Pixel 3a XL Case, pp. 1-2, Retrieved from the Internet <URL: https://www.poeticcases.com/products/guardian-2019-google-pixel-3-xl-lite case?pr_prod_strat=copurchase&pr_rec_pid=2391349002317&pr_ref_pid=8958382345&pr_seq=uniform &variant=21184753139789>.

Amazon, Galaxy S7 Edge Case, pp. 1-10, Retrieved from the Internet <URL: https://www.amazon.com/gp/product/B019WUS98S/ref=as_li_qf_sp_asin_il_tl?ie=UTF8&camp=1789&creative=9325&creativeASIN=B019WUS98S&linkCode=as2&tag=thebittetruth-20&linkId=GWBYGOGHACXLBXQY>.

* cited by examiner

HOUSING FOR A PORTABLE ELECTRONIC DEVICE

FIELD OF DISCLOSURE

This disclosure relates to a housing, case or enclosure for a portable electronic device.

BACKGROUND

In some prior art, the housing of a portable electronic device may be awkward to grip or hold onto while using or transporting the device. Accordingly, there is need for improved design of a housing for a portable electronic device that supports comfortable and reliable gripping by users of the portable electronic devices and that is sufficiently ergonomic for long-term use.

SUMMARY

In accordance with one embodiment, a housing is configured to receive a portable electronic device. The housing comprises a front frame that has elevated rectangular border and corner members around a central electronic display. Ones of the corner members have generally planar sections that are joined by a radiused edges or chamfered edges. A rear frame comprises edge members that are joined at substantially orthogonal angles at the plurality of corner members. A first vertical protrusion extends outward from the rear frame or a rear face of the electronic device. The first vertical protrusion has a first axis and an arched cross section or mounded cross section with a central peak region.

BRIEF DESCRIPTION OF THE DRAWINGS

Like reference numbers in any set of two or more drawings indicates like elements or features.

DETAILED DESCRIPTION

Figure 1:
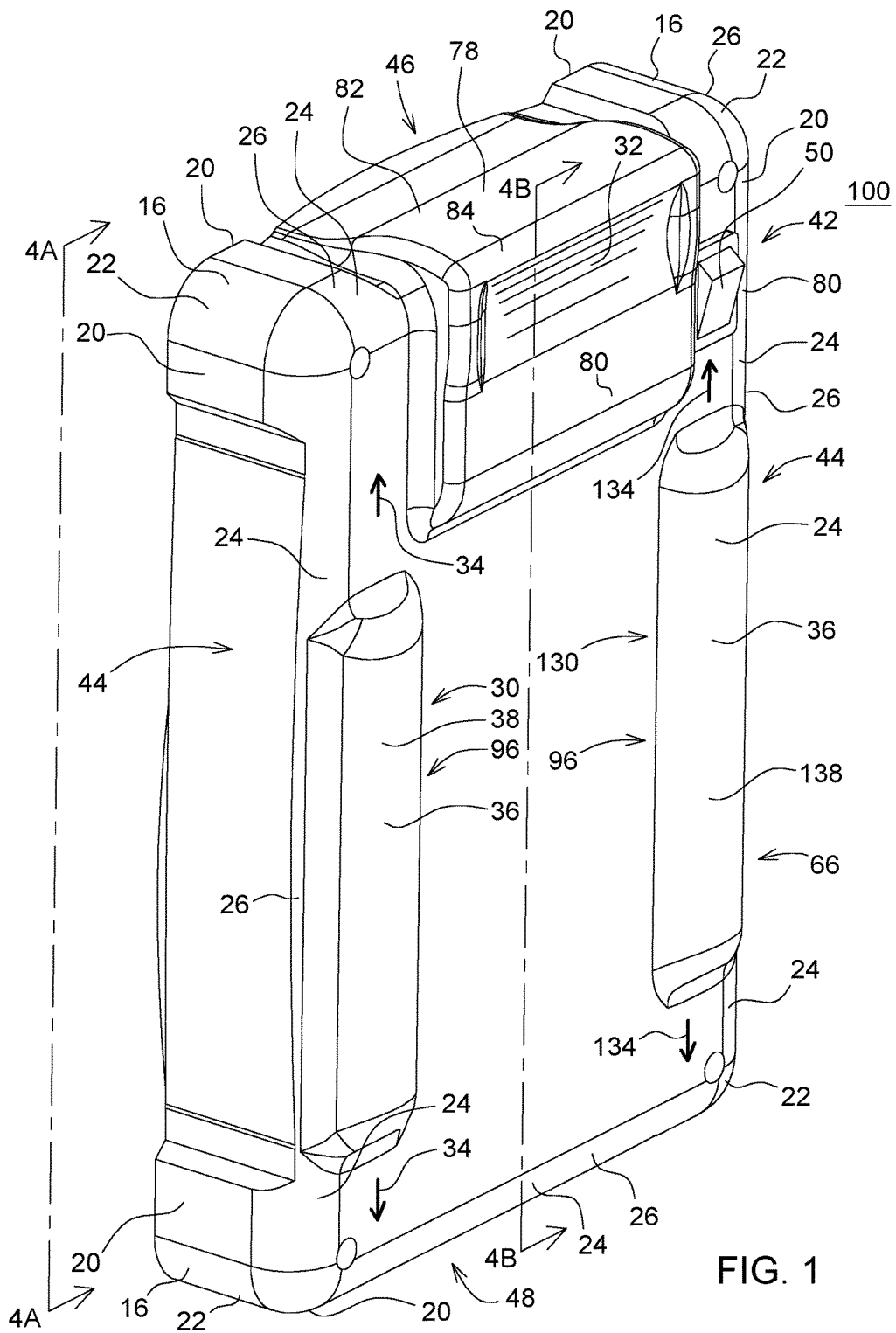
FIG. 1 is a perspective, rear view of one embodiment of a housing for a portable electronic device in accordance with the disclosure.
Figure 2:
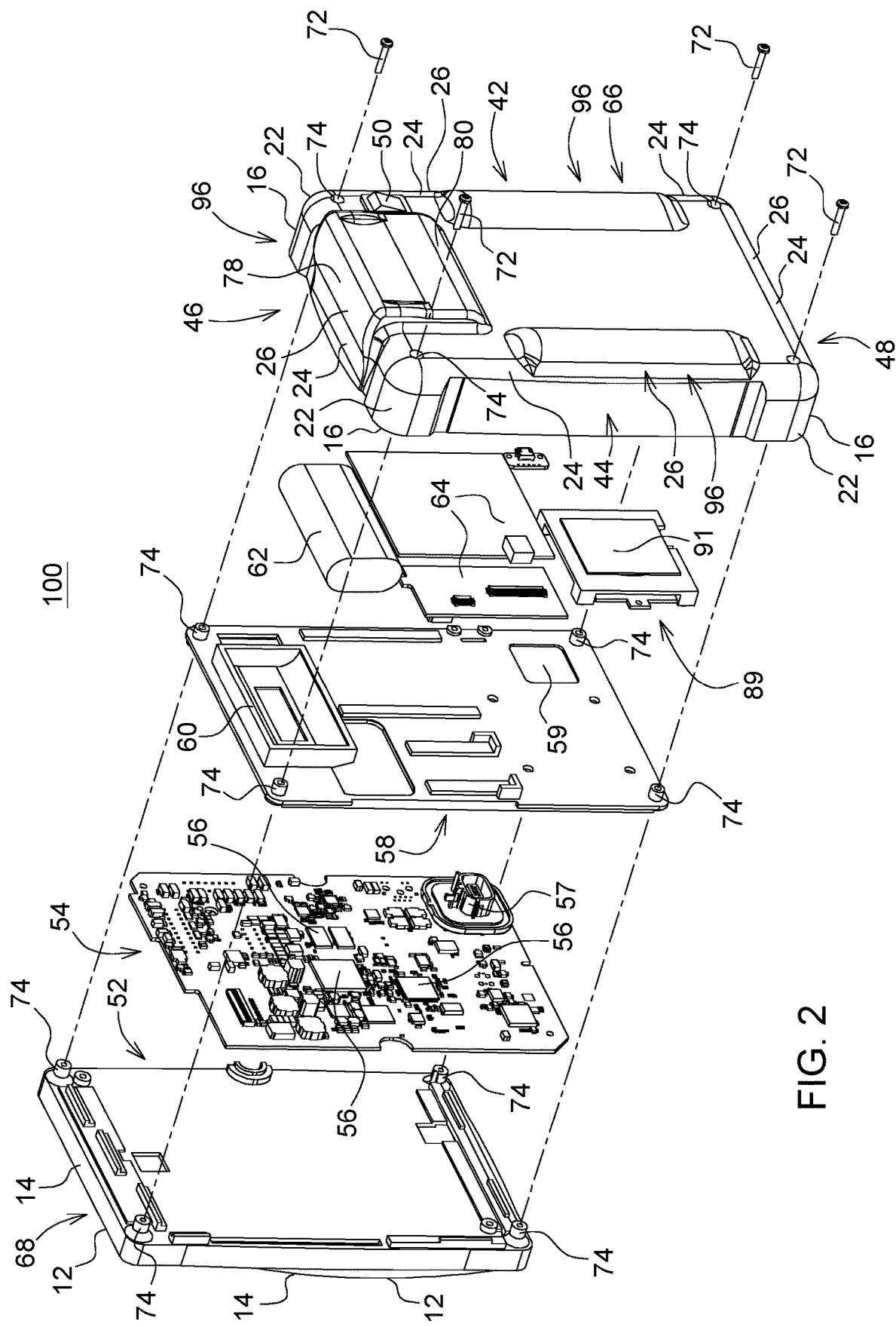
FIG. 2 is a rear, perspective exploded view of one embodiment of the housing for a portable electronic device consistent with FIG. 1.
Figure 3:
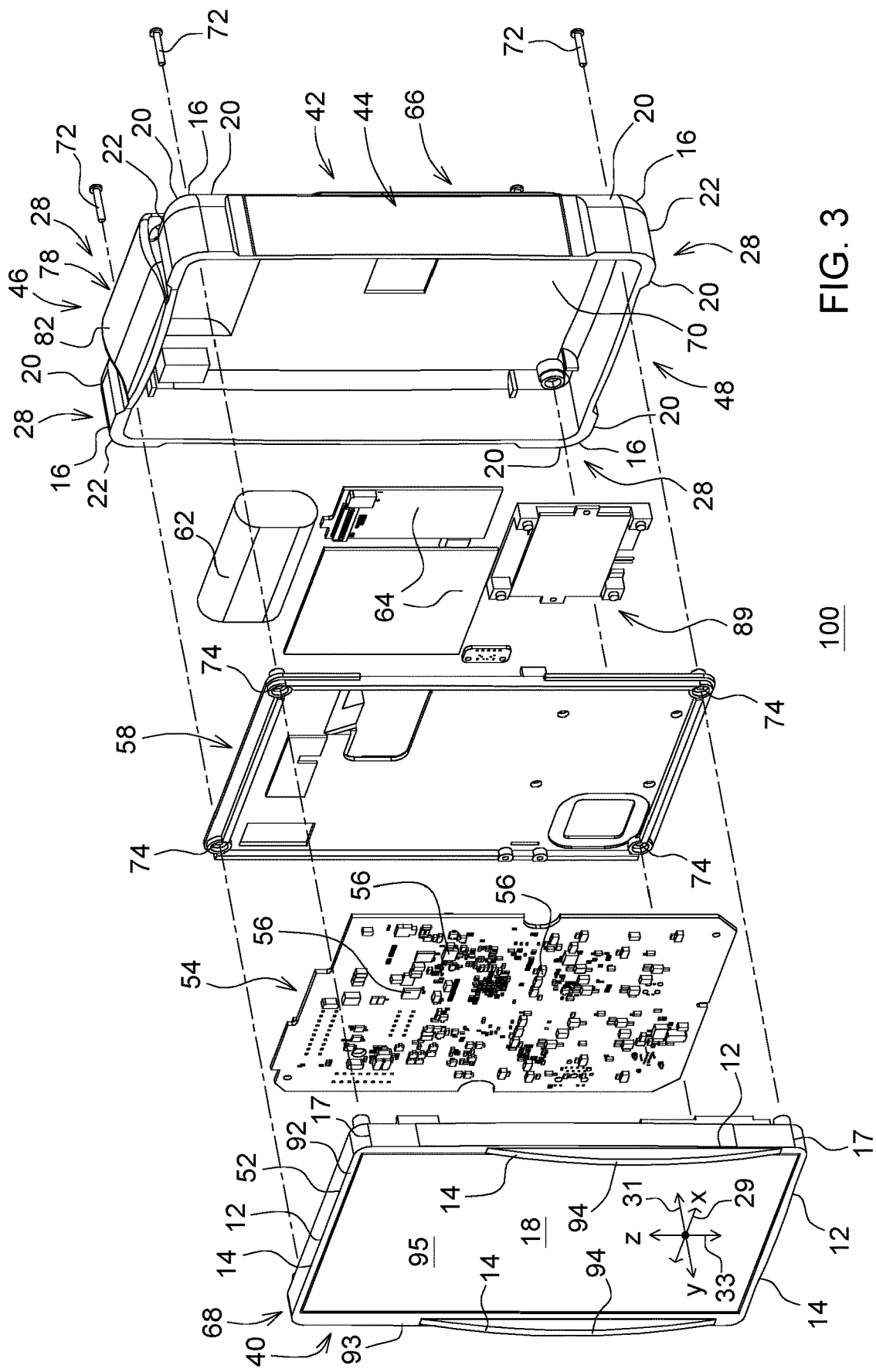
FIG. 3 is a front, perspective exploded view of one embodiment of the housing for a portable electronic device consistent with FIG. 1.

In accordance with one embodiment with reference to FIG. 1, FIG. 2 and FIG. 3, a housing is configured to house a portable electronic device 100; more particularly, to receive, enclose or protect one or more circuit boards (54, 64 in FIG. 2) and associated electronic components 56 (in FIG. 2) of the portable electronic device 100. The housing comprises a front frame 12 that has elevated border 14 (e.g., elevated substantially rectangular border) and optional radiused corner members (e.g., chamfered or rounded corners) around a central electronic display 18.

A rear frame 24 of the housing comprises corner members 16 that have generally planar sections 20 that are joined by a radiused edges 22 or chamfered edges. A rear frame 24 comprises edge members 26 that are joined at substantially orthogonal angles 28 of at the plurality of corner members 16. On a rear face 42 of the electronic device 100, a first vertical protrusion 30 (in FIG. 1 and FIG. 5) extends outward from the rear frame 24. The first vertical protrusion 30 has an first axis 34 and an arched cross section 36 or mounded cross section with a central peak region 38 (above a lower planer portion of the rear face 42), where the cross section 36 is generally or substantially perpendicular to the first axis 34 and where the cross-section 36 may be defined in the X-Y plane formed by the intersection of the X-axis 29 and Y-axis 31. In one embodiment, the first axis 34 is parallel to a central longitudinal axis (Z-axis 33) of the front frame 12 or the rear frame 24. Further, the top 46 or bottom 48 of the housing is generally oriented in a plane defined by the intersection of the X-axis 29 and Y-axis 31, or substantially parallel to the plane. FIG. 2 illustrates the orthogonal X-axis 29, Y-axis 31 and Z axis 33 relative to the housing and its components, such as the front frame 12.

As illustrated in FIG. 1, on a rear face 42 of the housing resides a first vertical protrusion 30 and a second vertical protrusion 130. In one embodiment, the first vertical protrusion 30 has a central peak region 38 that is defined by the arched cross section 36 or mounded cross section. For example, the central peak region 38 comprises a substantially elliptical area with its major axis aligned with the first axis 34; or generally rectangular surface area aligned with or along the first axis 34; or strip 76 aligned with or extending along a first axis 34. A second vertical protrusion 130 is spaced apart from the first vertical protrusion 30.

The second vertical protrusion 130 has an arched cross section 36 or mounded cross section with a secondary central peak region 138 (above a lower planer portion of the rear face 42). In one configuration, the second vertical protrusion 130 has a secondary central peak region 138 that is defined by the arched cross section 36 or mounded cross section. For example, the secondary central peak region 138 may comprise a substantially elliptical area with its major axis aligned with the second axis 134; or generally rectangular surface area aligned with or along the second axis 134; or strip 176 aligned with or extending along a second axis 134.

In one embodiment, the second axis 134 is parallel to a central longitudinal axis (Z-axis 33) of the front frame 12 or the rear frame 24. Further, the top 46 or bottom 48 of the housing is generally oriented in a plane defined by the intersection of the X-axis 29 and Y-axis 31, or substantially parallel to the plane. FIG. 2 illustrates the orthogonal X-axis 29, Y-axis 31 and Z axis 33 relative to the housing and its components, such as the front frame 12. The second vertical protrusion 130 has an second axis 134 and an arched cross section 36 or mounded cross section with a central peak region 38, where the cross section 36 is generally or substantially perpendicular to the second axis 134 and where the cross-section 36 may be defined in the X-Y plane formed by the intersection of the X-axis 29 and Y-axis 31.

Figure 5:
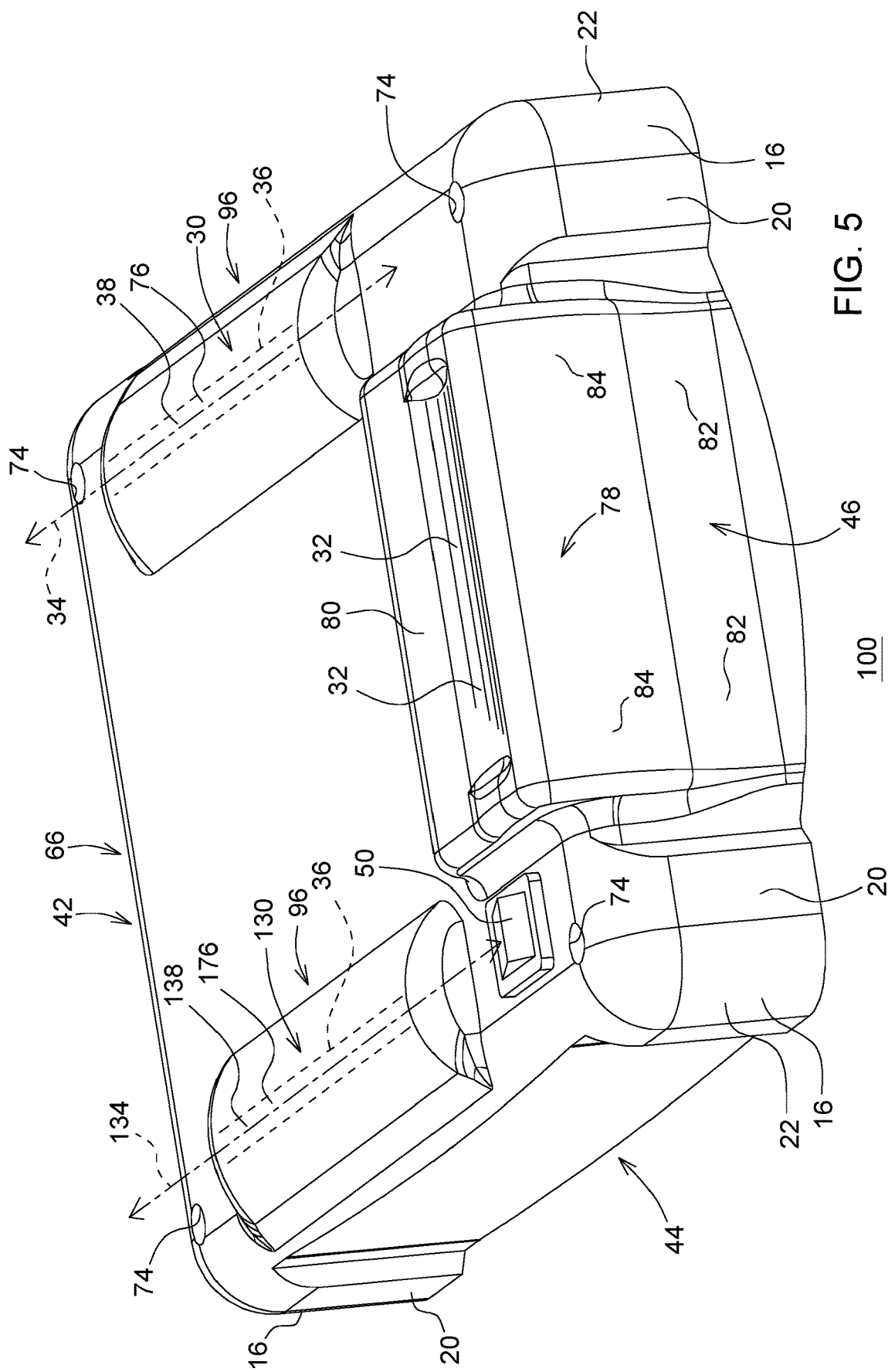
FIG. 5 is a rear view of one embodiment of the housing for a portable electronic device consistent with FIG. 1.

In another embodiment, the central peak region (e.g., or primary central peak region 38) comprises a strip 76 aligned with or along a first axis 34. Similarly, the central peak region (e.g., secondary central peak region 138) comprises a strip 176 aligned with or along a second axis 134. As illustrated in FIG. 5, the first axis 34 is generally parallel to the second axis 134.

In FIG. 1, the housing further comprises an upper protrusion 78. For example, a top portion 82 of the upper protrusion 78 extends above the top 46 (e.g., top side) and outward from a rear face 42 of the housing or electronic device 100. An upper protrusion 78 comprises a rear portion 80 and a top portion 82, where a protruding rear portion 80 has a central recess 32 therein; the top portion 82 has a sloped profile 84 with a peak height 86 (in FIG. 4A) at an intersection between the rear portion 80 and the top portion 82. Here, the peak height 86 is relative to a reference point on the Z-axis 33, or parallel thereto, such as a reference point on the rear face 42 of the housing. The central recess 32 is configured to receive at least part of one or more fingers to facilitate holding or transporting (e.g., ergonomically) the electronic device 100.

Although FIG. 1 illustrates a switch 50 (e.g., rocker or push button) between the upper protrusion 78 or rear portion 80 and a side 44 of the housing, the switch 50 is optional and may be deleted from the rear face 42 of the housing.

In one configuration, the housing has a framework that comprises a front frame 12 and rear frame 24 that are connected or joined by corner members (e.g., 16). For example, the front frame 12 and rear frame 24 can be joined by fasteners 72 and openings 74 (e.g., threaded, unthreaded or a combination of threaded and unthreaded openings) to receive the fasteners 72.

In an alternate embodiment, the front frame 12 and the rear frame 24 can be joined by snap-fit connectors, adhesively bonded, press-fitted, or a welded plastic or thermoplastic connection, or another suitable connection technique.

A vertical member 93 of front frame 12 has an outer arcuate profile 94 that is elevated above a generally planar face 95 of the electronic display 18. The front frame 12 may provide support for or retain the electronic display 18, such as a liquid crystal display. The generally planar face 95 of the electronic display 18 and the front frame 12 form or define a front face 40 of the electronic device 100.

At or proximate to intersection of the sides 44 and the rear face 42, the rear frame 24 is formed by edge members 26, such as an interconnected or unitary substantially rectangular rear frame 24 that is intercepted or interrupted by the upper protrusion 78 at the top 46 of the electronic device 100. In one embodiment, the edge members 26 comprise a plurality of rectilinear edge members 26, with an orthogonal inner surface and a chamfered outer surface, although in other configurations the edge members 26 may comprise substantially orthogonal and elongated corner members. As illustrated in FIG. 1, the edge members 26 connect to the generally planar sections 20 of the edge members 26. The corner members 16 join and form the unitary framework of the rear frame 24. Similarly, the corner members 17 join and form the unitary framework of the front frame 12. Together, the interconnected front frame 12 and rear frame 24, form unitary framework may provide structural support for the housing and rigidity to the housing to protect the circuit boards (54, 64), display 18 and electronic components 56 mounted in the interior 70 of the housing, as illustrated in FIG. 2 and FIG. 3.

FIG. 2 shows that the housing comprises a front enclosure 68 and a rear enclosure 66, where the front enclosure 68 is secured or fastened to the rear enclosure 66. For example, the front enclosure 68 is secured or fastened to the rear enclosure 66 via one or more fasteners 72, such as any combination of the following items: screws, bolts, clips, snap-fit connectors, nuts or threaded holes. As illustrated in FIG. 2 and FIG. 3, an interior 70 of the rear enclosure 66 can receive one or more of the following: a primary circuit board 54, a dielectric support structure 58, a battery 62 or power supply (e.g., capacitor and battery combination), and one or more secondary circuit boards 64. The primary circuit board 54 may comprise a double-sided circuit board with electrically conductive traces on a dielectric substrate, where electronic components 56 or electrical components mounted on one side or both sides of the double-sided circuit board. Similarly, one or more secondary circuit boards 64 have electrically conductive traces on a dielectric substrate, where electronic components 56 and/or electrical components mounted on the secondary circuit boards 64, which can send electrical signals and/or electromagnetic signals between the primary circuit board 54 and one or more secondary circuit boards via conductors, wires, cables (e.g., ribbon cables and/or coaxial cables).

The dielectric support structure 58 may comprise a carrier and a cradle 60 or cavity for securing or mounting a battery 62 or power supply. The dielectric support structure 58 may be composed of a plastic, polymer, a plastic composite, a polymer composite (e.g., fiber reinforced polymer) or a ceramic material. The dielectric support structure 58 may support, secure, or provide a mounting structure for any of the following: a primary circuit board 54, a dielectric support structure 58, a battery 62 or power supply, and one or more secondary circuit boards 64. For example, as illustrated in FIG. 2, the primary circuit board 54 is secured or attached to a first side of the dielectric support structure 58, whereas one or more secondary circuit boards 64, and optionally a battery 62, are secured or attached to a second side of the dielectric support structure 58. The first side of the dielectric support structure 58 is opposite the second side of the dielectric support structure 58. Further, the dielectric support structure 58 has an opening 59 for an electrical connector 57 on the primary circuit board 54. In one configuration, the dielectric support structure 58 provides an electrically insulated interface between the primary circuit board 54, and its electronic components 56, and one or more secondary circuit boards 64 and their electronic components 56.

In one embodiment, a dielectric support structure 89 supports an optional inductive charging element 91 that can wirelessly charge the battery via an electromagnetic signal, such as when an inductive charging unit is positioned adjacent to the outside of the housing proximate to the optional inductive charging element 91.

Although the front enclosure 68, the dielectric support structure 58 and the rear enclosure 66 have aligned openings 74 for receiving fasteners 72, in other embodiments the front enclosure 68, the dielectric support structure 58, the primary circuit board 54 and the secondary circuit boards 64 may have aligned openings 74 for receiving the fasteners 72. The front enclosure 68 features a display carrier 52 that surrounds or frames a perimeter of the central electronic display 18. The rear enclosure 66 has a top 46, sides 44 and a bottom 48, where the bottom 48 is opposite the top 46.

FIG. 3 is similar to FIG. 2, except FIG. 3 shows a perspective view of a front side 44 of the front enclosure 68 with the electronic display 18 mounted in the front enclosure 68. FIG. 3 illustrates the elevated border 14 (e.g., elevated generally rectangular border) of the front enclosure 68, along with outer arcuate profile 94 that is elevated above a generally planar face 95 of the electronic display 18. In one configuration, the elevated border 14 comprises edge members 92, such as a substantially rectilinear edge members or other trim members.

Figure 4B:
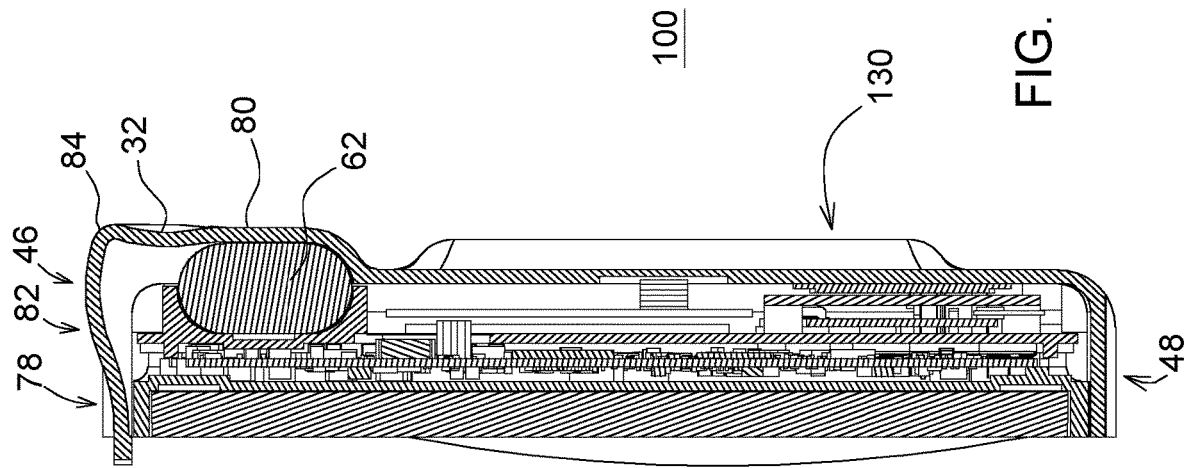
FIG. 4B is cross sectional view along reference line 4B-4B of FIG. 1.
Figure 4A:
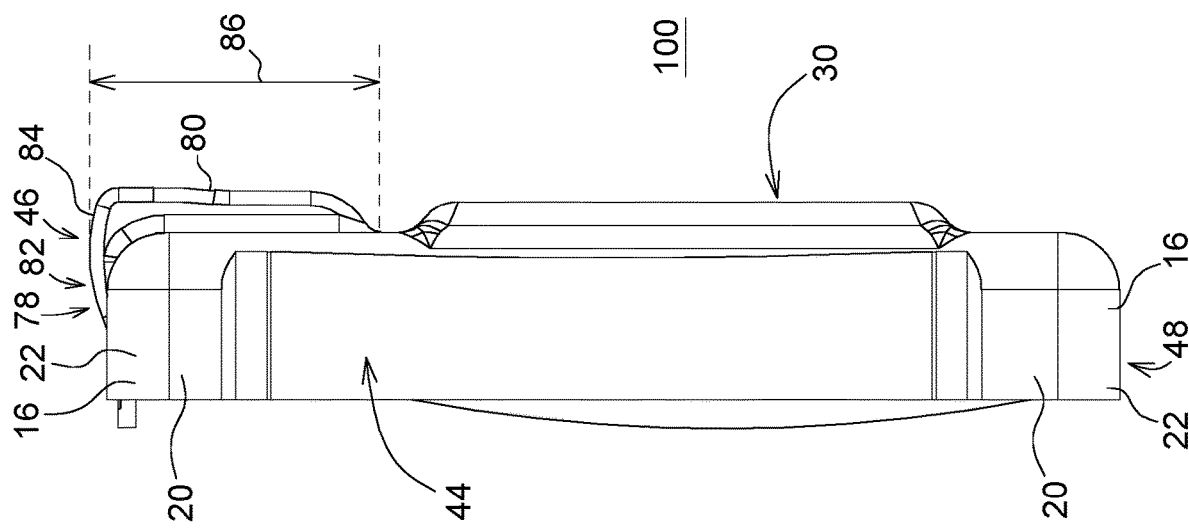
FIG. 4A is side view along reference line 4A-4A of FIG. 1.

FIG. 4A is side 44 view along reference line 4A-4A of FIG. 1. FIG. 4A shows the first vertical protrusion 30 and the upper protrusion 78 extending above the rear face 42 of the rear enclosure 66. As illustrated in FIG. 4A, the first vertical protrusion 30 has a generally mounded shape with rounded edges that are formed by a series of elliptical contours of equal height or distance from an adjoining substantially planar region or background region of the rear face 42.

Meanwhile, the upper protrusion 78 extends outward from the top 46 and rear face 42. The upper protrusion 78 can be defined by a set of subdivisions or parts of the outer surface area of the upper protrusion 78, such as the top portion 82 on the top 46 that transitions to a sloped profile 84. The sloped profile 84 is the intermediate surface area between the top portion 82 and the rear portion 80. A central recess 32 is formed or defined within the rear portion 80. For example, the central recess 32 may define a cavity or substantially semi-cylindrical hollow volume within the rear portion 80 of the upper protrusion 78. As illustrated in FIG. 4A, the rear portion 80 has a peak height 86 from a lower limit of the rear portion 80 to an upper limit of the rear portion 80.

FIG. 4B is cross-sectional view along reference line 4B-4B of FIG. 1, where the cross section of the assembled, inner assembly of FIG. 1 and FIG. 2 is illustrated. FIG. 4B reveals a cross section of the primary circuit board 54 with electronic components 56 mounted on both sides of the primary circuit board 54 and the secondary circuit boards 64. As shown in FIG. 4B, the primary circuit board 54 is separated from the secondary circuit boards 64 by the dielectric support structure 58. Further, the battery 62 is mounted within the cradle 60 of the dielectric support structure 58.

FIG. 5 is a rear view of one embodiment of the housing for a portable electronic device 100 consistent with FIG. 1. Like reference numbers in FIG. 1 and FIG. 5 indicate like elements or features. FIG. 5 provides an illustration of the rear central recess 32 in the upper protrusion 78 to rest or provide a receptable (e.g., ergonomic recess or gripping volume) for fingers of a hand that are holding or carrying the electronic device 100.

Figure 6:
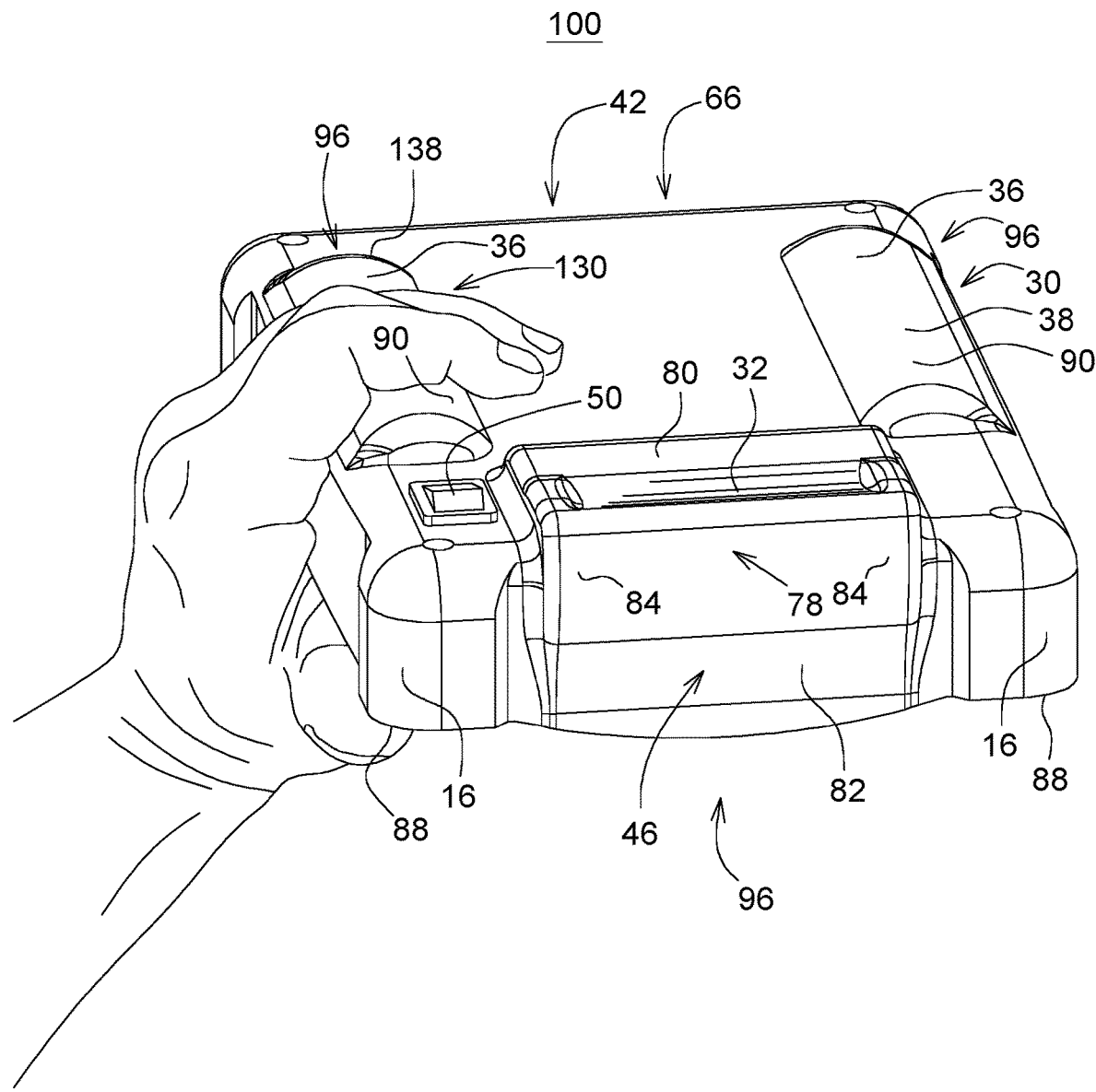
FIG. 6 is a rear, top perspective view of one embodiment of the housing for a portable electronic device consistent with FIG. 1, where the user can grip a side of the housing with a hand as illustrated.

As illustrated in FIG. 6, the upper one of the corner members 16 provides a first contact region 88 for a thumb (or digit) of a user and wherein the first vertical protrusion 30 or the second vertical protrusion 130 provides a second contact region 90 for one or more fingers of the user. Further, the first contact region 88 and the second contact region 90 can be contacted simultaneously (e.g., by a human hand, fingers, or portions of either) to hold ergonomically the housing. In one embodiment, the first contact region 88, the first vertical protrusion 30 and the second contact region 90, and the second vertical protrusion 130 and the upper protrusion 78 may have a gripping surface 96. For example, the gripping surface 96 may comprise a relief surface treatment or quasi-relief surface treatment that features one or more of the following: a raised surface, a embossed surface, a set of ribs (e.g., parallel straight ribs or parallel curved ribs), a set spiral protrusions, a set of concentric elliptical protrusions, or a set of concentric circular protrusions. For example, the relief surface treatment may extend from lower plane and be limited to a height of a projected upper plane that is generally parallel to the lower plane. Further, the projected upper plane can intercept or be defined to be coextensive with a peak height or maximum uniform height of a raised surface, embossed surface, ribs, spiral protrusions, web-like protrusions, concentric elliptical protrusions, concentric circular protrusions or other geometric patterns for improved gripping by hands or fingers. Further, the gripping surface 96, or its surface treatment or its patterns, may be composed of an elastomer, synthetic rubber, natural rubber, silicone, polymer, or a resilient material that is resiliently deformable or resiliently compressible by hands or fingers to conform to the shape of the fingers or hands for improved gripping. In one configuration, the gripping surface 96 is bonded or adhesively bonded to one or more of the following exterior surfaces of the electronic device 100: (a) first contact region 88, (b) second contact region 90, (c) upper protrusion 78, (d) top portion 82, (e) rear portion 80, (f) recess 32 (e.g., central recess), (g) first vertical protrusion 30, and (h) second vertical protrusion 130.

Figure 7:
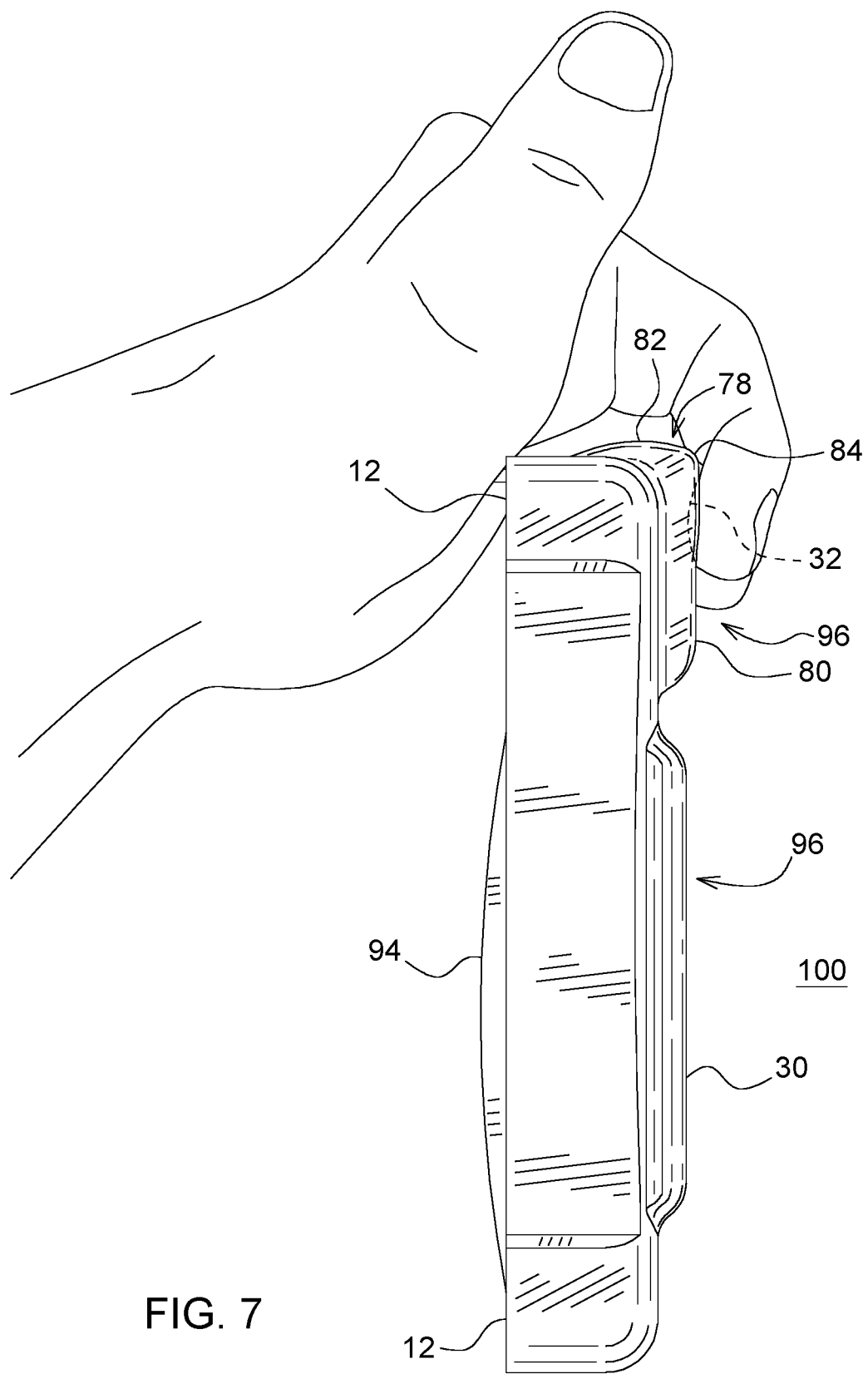
FIG. 7 is a side view of one embodiment of the housing for a portable electronic device, consistent with FIG. 1, where the user can grip the top of the housing with a hand as illustrated.

As illustrated in FIG. 7, the upper protrusion 78 is gripped with a palm against the front frame 12 (e.g., an edge member 92 or top or leading edge of the front frame 12) and one or more fingers within the recess 32 of the upper protrusion 78 to form a grip on the housing.

In FIG. 6 and FIG. 7, the three-dimensional ergonomic features, such as the first vertical protrusion 30, the second vertical protrusion 130 and the upper protrusion 78 with the central recess 32 are ergonomically designed for holding or carrying the electronic device 100 for extended periods of time. Accordingly, the three-dimensional ergonomic features may be more comfortable from a human-factors perspective than a high friction or low profile ribbed surface treatment, alone. Further, the three-dimensional ergonomic features of FIG. 6 and FIG. 7 are well-suited for use with a gloved hand that is typical in farming and construction work. In some configurations, the three-dimensional ergonomic features of the present disclosure can accommodate or interface with several fingers as well as a user's palm. Accordingly, the user of the electronic device 100 may experience less fatigue than using two fingers to hold the electronic device 100.

Although illustrative embodiments have been described in this disclosure, it will be apparent that one or more of such illustrative embodiments may be varied in many ways. Such variations are not to be regarded as a departure from the spirit and scope of illustrated embodiments, and any and all such equivalents and modifications, which would be obvious to one skilled in the art, are intended to be included within the scope of the claims.

The following is claimed:

1. A housing configured to receive a portable electronic device, the housing comprising:
   a front frame comprising a raised rectangular border around a central electronic display;
   a plurality of corner members, ones of the corner members having generally planar sections that are joined by a radiused edges or chamfered edges;
   a rear frame comprising a plurality of edge members that are joined at orthogonal angles at the plurality of corner members;
   a first vertical protrusion extending outward from the rear frame, the first vertical protrusion having a first axis and an arched cross section or mounded cross section with a central peak region, wherein the central peak region of the vertical protrusion extends along more than one quarter of a length of the rear frame;
   an upper protrusion comprising a rear portion and a top portion, wherein the rear portion has a central recess, the central recess comprising a cavity within the rear portion of the upper protrusion such that the cavity is recessed within the rear portion on all sides of the cavity; and wherein the top portion has a sloped profile with a peak height at an intersection between the rear portion and the top portion.

2. The housing according to claim 1, wherein the central peak region comprises a strip aligned with or along a first axis.

3. The housing according to claim 1 further comprising:
a second vertical protrusion spaced apart from the first vertical protrusion, the second vertical protrusion having an arched cross section or mounded cross section with a secondary central peak region.

4. The housing according to claim 3, wherein the secondary central peak region is a strip aligned with or along a second axis.

5. The housing according to claim 1 further comprising:
the central peak region comprising a strip aligned with or along a first axis;
a secondary central peak region comprising a strip aligned with or along a second axis; and
wherein the first axis is parallel to the second axis.

6. The housing according to claim 1, wherein an upper one of the corner members provides a first contact region for a thumb of a user and wherein the first vertical protrusion or the second vertical protrusion provides a second contact region for one or more fingers of the user, where the first contact region and the second contact region can be contacted simultaneously to hold ergonomically the housing.

7. The housing according to claim 6, wherein the first contact region and the second contact region comprise a gripping surface, wherein the gripping surface has a relief surface treatment.

8. The housing according to claim 7, wherein the relief surface treatment or the gripping surface comprises a resilient material selected from the group consisting of an elastomer, synthetic rubber, a polymer and silicone.

9. The housing according to claim 1 further comprising an upper protrusion that can be gripped with a palm against the front frame and one or more fingers within recess of the upper protrusion to form a grip on the housing.

10. The housing according to claim 9, wherein the upper protrusion further comprises a central recess in a rear portion of the upper protrusion, wherein the central recess is configured to receive at least part of one or more fingers.

11. The housing according to claim 9, wherein the upper protrusion comprises a gripping surface and wherein the gripping surface has a relief surface treatment.

12. The housing according to claim 11, wherein the relief surface treatment or the gripping surface comprises a resilient material selected from the group consisting of an elastomer, synthetic rubber, a polymer and silicone.

13. The housing according to claim 1, wherein the edge members comprise a plurality of rectilinear edge members that connect to the generally planar sections and the radius of at the plurality of corner members.

14. The housing according to claim 1, wherein a vertical member of front frame has an arcuate side profile that is elevated above a generally planar face of the electronic display.

15. The housing according to claim 1, wherein the cavity comprises a substantially semi-cylindrical hollow volume within the rear portion of the upper protrusion.

* * * * *